United States Patent [19]
Kobayashi et al.

[11] Patent Number: 5,742,487
[45] Date of Patent: Apr. 21, 1998

[54] IC CARRIER

[75] Inventors: Yoshito Kobayashi, Gyoda; Masayuki Nozawa, Ageo, both of Japan

[73] Assignees: Advantest Corporation, Tokyo; Enplas Corporation, Saitama, both of Japan

[21] Appl. No.: 540,886

[22] Filed: Oct. 11, 1995

[30] Foreign Application Priority Data

Oct. 11, 1994 [JP] Japan .................................. 6-245172

[51] Int. Cl.⁶ .................................................. H05K 7/02
[52] U.S. Cl. .................... 361/809; 361/820; 257/726; 257/727; 206/560
[58] Field of Search .................... 361/754, 759, 361/769, 740, 807, 809, 820; 439/72, 73, 266, 330; 257/726, 727; 206/722, 725, 726, 560, 565

[56] References Cited

U.S. PATENT DOCUMENTS

| | | | |
|---|---|---|---|
| 4,789,345 | 12/1988 | Carter | 439/330 |
| 4,881,639 | 11/1989 | Matsuoka et al. | 206/560 |
| 4,993,955 | 2/1991 | Savant | 439/73 |
| 5,290,192 | 3/1994 | Espenshade et al. | 439/266 |
| 5,320,550 | 6/1994 | Uratsuji et al. | 439/266 |
| 5,494,169 | 2/1996 | Matsuoka | 206/722 |

*Primary Examiner*—Leo P. Picard
*Assistant Examiner*—John B. Vigushin
*Attorney, Agent, or Firm*—Staas & Halsey

[57] ABSTRACT

Latches are pivotally provided on opposite sides of an IC device stored in the pocked of an IC carrier. Connecting arms of the latches are engaged in engagement holes formed in actuator members which are biased upwardly by springs. The top surface of the IC carrier, except the IC pocket, is covered by an actuating plate. The positioning pins of an IC set/removal mechanism are inserted into holes of the IC carrier so as to cause the mounting plate to which the pins are secured to press the actuating plate down against the top face of the IC carrier causing the actuator members to pivot the latches, whereby the hold-down lugs of the latches are retracted from the top of the IC. The IC is now ready to be picked up by a suction pad.

38 Claims, 13 Drawing Sheets

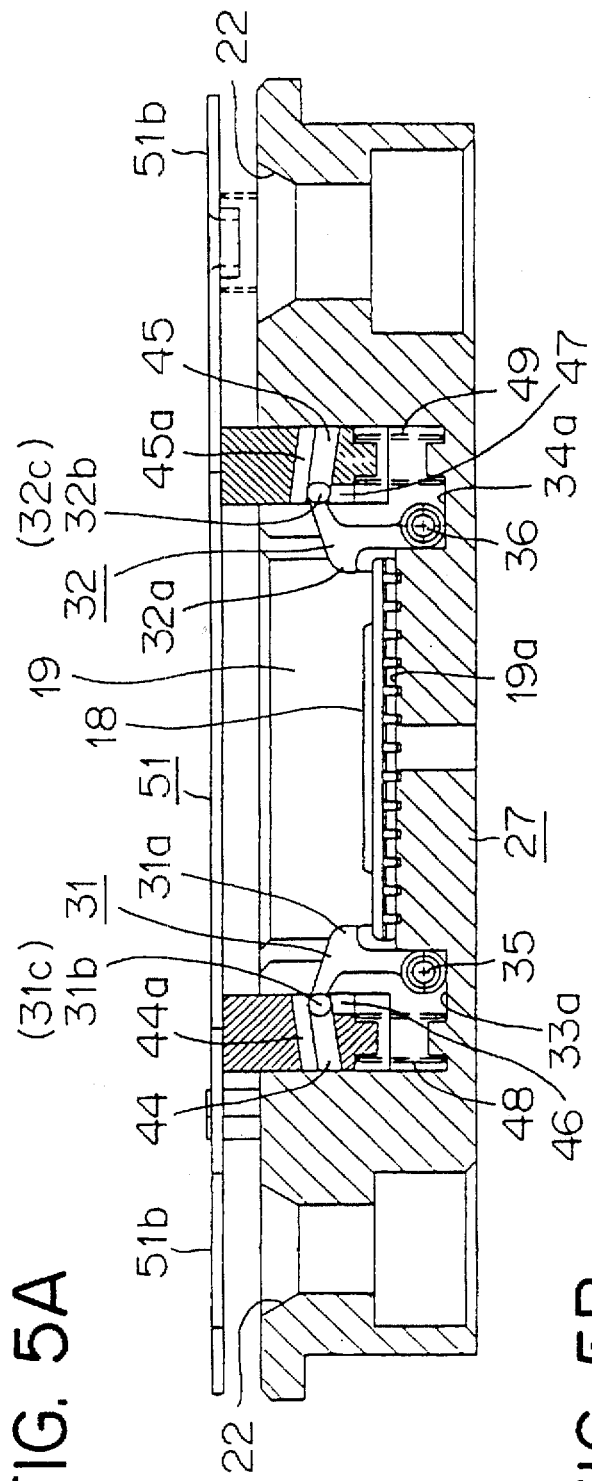
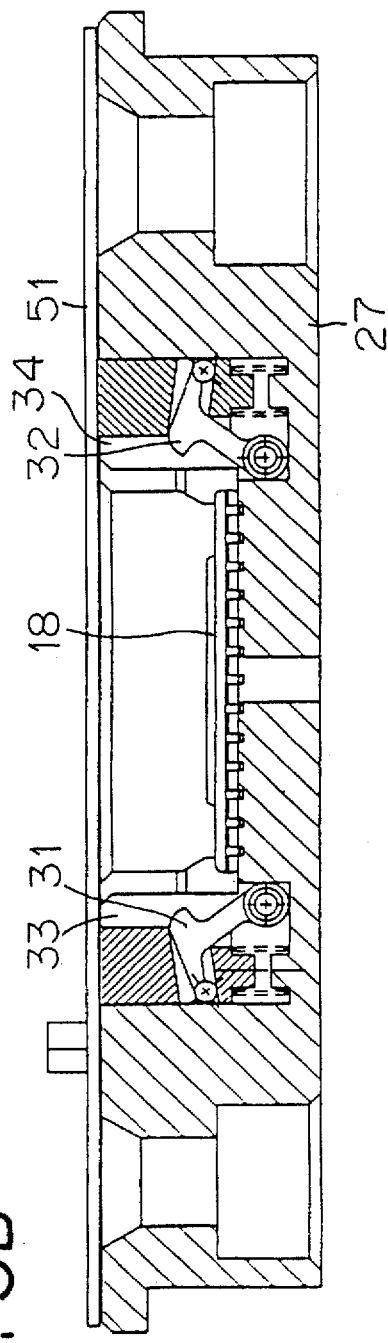
FIG. 5A
FIG. 5B

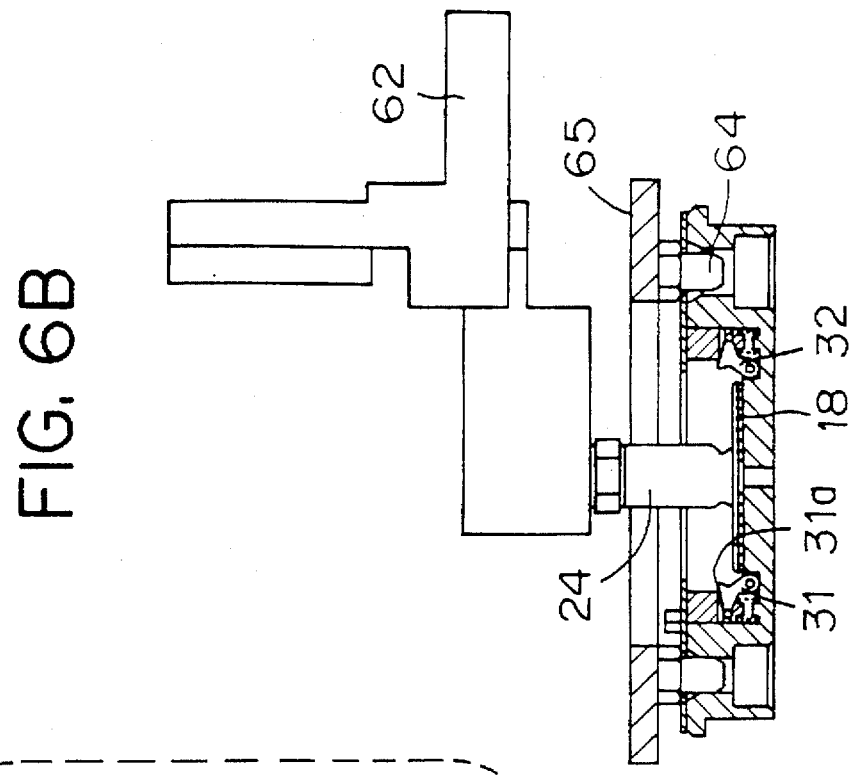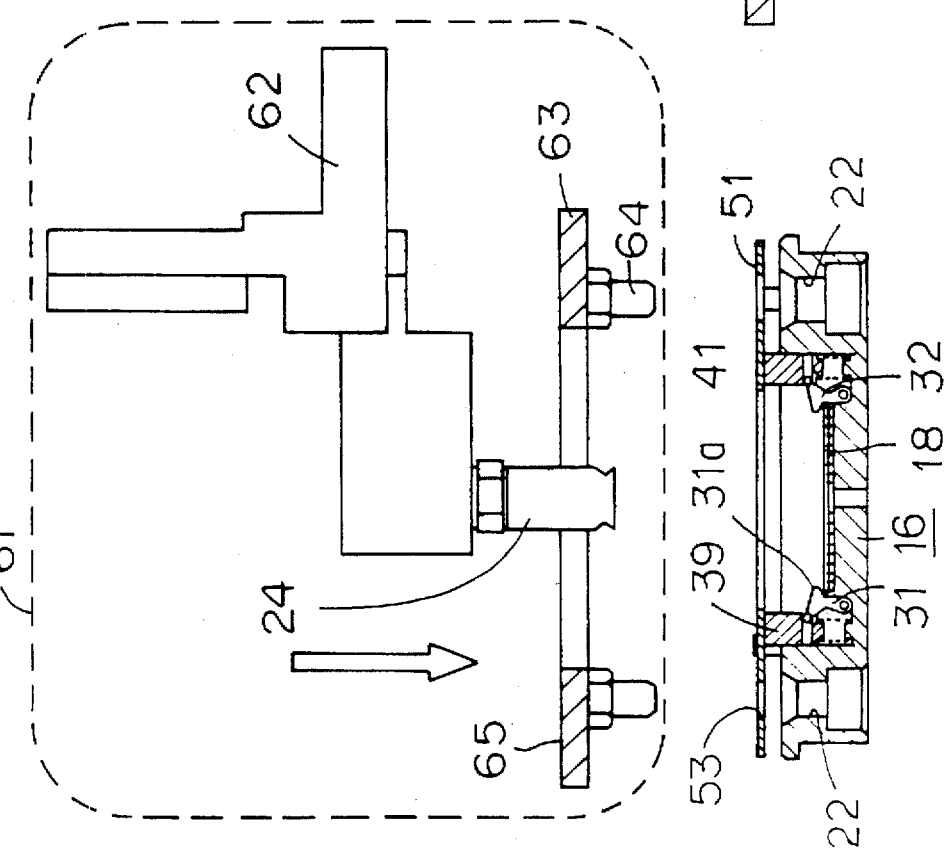

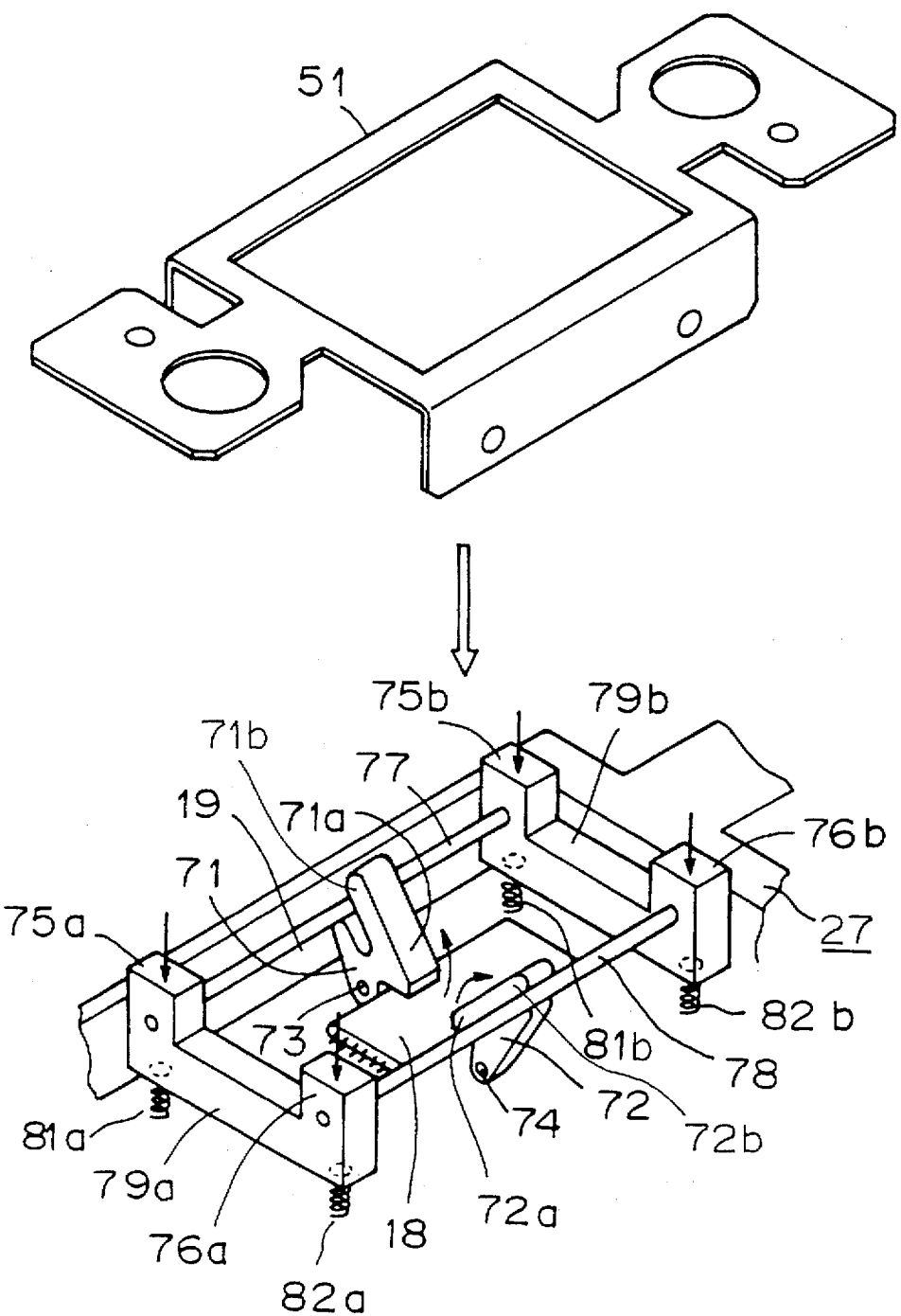

IC CARRIER

FIELD OF THE INVENTION

This invention relates to IC carriers for use to transport IC devices on a tray for testing, and particularly, to IC carriers for accommodating IC devices so as to be carried on a tray.

DESCRIPTION OF THE RELATED ART

FIG. 1 illustrates a tray with IC carriers loaded thereon for use in the prior art horizontal transporting system (IC handler). The tray 11 comprises a rectangular frame 12 having a plurality of equally spaced apart parallel cleats 13 between the opposed side frame members 12a and 12b of the frame, each of the cleats 13 having a plurality of equally spaced apart mounting lugs 14 protruding therefrom on both sides thereof and each of the side frame members 12a, 12b opposing the adjacent cleats having similar mounting lugs 14 protruding therefrom such that an array of carrier compartments 15 are formed, each of the compartments being defined between a pair of opposed cleats 13 and two adjacent lugs 14 extending from each of the cleats and between one of the cleats 13 and either one of the adjacent side frame members 12a and 12b and two adjacent lugs 14 extending from each of the cleats and one of the frame members. An IC carrier 16 is seated in each of the carrier compartments 15 and secured to two mounting lugs 14 in a floating manner by fasteners 17.

Each of IC carriers 16 is of identical shape and size in its outer contour and has an IC pocket 19 for accommodating an IC device 18 therein. The shape of the IC pocket 19 of each IC carrier 16 is determined depending on that of the IC device 18 to be accommodated therein. In the illustrated embodiment the IC pocket 19 is in the shape of a generally square recess. The IC carrier 16 is formed at its opposed ends with guide pin holes 22 and mounting holes 21 for fastening the carrier to the mounting lugs 14.

The tray 11 with IC carriers 16 mounted thereto is moved in a circulating manner through an IC transporting system (IC handler) while the tray receives IC devices 18 in the IC carriers 16 and is then subjected to the testing temperature, followed by having the IC devices undergo the testing, and finally transfers the IC devices onto different take-out trays sorted on the basis of the test results.

It has heretofore been a common practice to use a pair of latches 23 attached to the body 27 of the IC carrier 16 in order to prevent IC 18 from slipping out of place in the carrier or jumping out of the carrier, as shown in FIG. 2. The prior art latch unit shown in FIGS. 2A and 2B comprises a pair of latches 23 integrally formed with the body 27 of the carrier and outstanding upwardly from the base of the IC pocket 19. The latches 23 are adapted to be expanded away from each other due to the resiliency of the resin material of which the carrier body 27 is made by a latch releasing mechanism 25 which is actuated simultaneously with the activation of an IC suction pad 24 for picking up an IC 18 when the IC is to be stored into and removed from the IC pocket 19. Upon the latch releasing mechanism 25 being moved out of engagement with the latches 23, the latches will snapback to their normal positions where they get hooked with the top surface of the stored IC 18 on its opposite sides.

FIGS. 2C and 2D illustrate another type of the conventional latch means comprising a pair of latches 23 integrally formed at one end with and extending from the side walls of the IC pocket 19. The free ends of the latches 23 are resiliently movable in opposing relation with the corresponding sides of the stored IC 18 and have hold-down protuberances 26 facing the top face of the IC.

However, the prior art latch unit has the drawback that it has a very short useful life since it is formed of resin material integrally with the carrier body to take advantage of the resiliency of the material.

In addition, the latches 23 are disposed so as to face the sides of the stored IC 18 from which no lead pins extend. Consequently, for ICs 18 shown in FIGS. 2B and 2D with lead pins extending from the sides different from those shown in FIGS. 2A and 2C, it is required to use a latch releasing mechanism 25 having a different direction of operation. In other words, it is not possible to employ a latch releasing mechanism 25 common to all types of ICs, but the latch releasing mechanism must be exchanged depending on the type of the IC.

SUMMARY OF THE INVENTION

It is an object of this invention to provide an IC carrier provided with a latch unit having a long useful life.

Another object of this invention is to provide an IC carrier having a latch releasing mechanism which may be used in common to all types of ICs.

According to a first aspect of the present invention, a pair of latches are pivotally carried by the body of an IC carrier on opposite sides of an IC device stored in the IC pocket of the IC carrier. Each of the latches has a hold-down lug movable between a first position facing the top face of the stored IC device and a second position retracted from the top face of the IC device as the latch is moved vertically. Actuator members are mounted in the body for vertical movements and normally biased upwardly by springs. The actuator members and the latches are drivingly connected so that the vertical movements of the actuator members cause the latches to pivot or swing about pivot axes.

According to a second aspect of the invention, the latch and the actuator member are joined together as a unitary member.

According to a third aspect of the invention, a pair of latches are carried by the the body of an IC carrier on opposite sides of an IC device stored in the IC pocket of the IC carrier for movements in a direction generally parallel to a support surface on which the IC device is supported. Each of the latches has a hold-down lug movable between a first position facing the top face of the stored IC device and a second position retracted from the top face of the IC device as the latch is moved horizontally. Actuator members are mounted in the body for vertical movements and normally biased upwardly by springs. The actuator members and the latches are drivingly connected so that the vertical movements of the actuator members cause the latches to move.

According to a fourth aspect of the invention, in the various embodiments according to the first to third aspects of the invention, an actuating plate configured to cover substantially the entire top surface of the carrier body except the top surface of the IC stored in the IC pocket is vertically movably carried by the body. The actuator members are positioned to underlying the actuating plate.

BRIEF DESCRIPTION OF THE DRAWINGS

FIG. 5A is a cross-sectional view of the IC carrier of FIG. 4A taken along the line I—I with the actuating plate 51 removed;

FIG. 5B is a cross-sectional view similar to FIG. 5A but illustrating the actuating plate 51 depressed;

FIG. 6A is an illustration showing the cross-section of the IC carrier of FIG. 3 prior to the IC being removed from the carrier and the IC set/removing mechanism;

FIG. 6B is a view similar to FIG. 6A but illustrating the suction pad being in abutment with the IC;

FIG. 7 is an exploded perspective view showing the principal parts of the IC carrier according to another embodiment of the first aspect of this invention;

DESCRIPTION OF THE PREFERRED EMBODIMENTS

Figure 1:
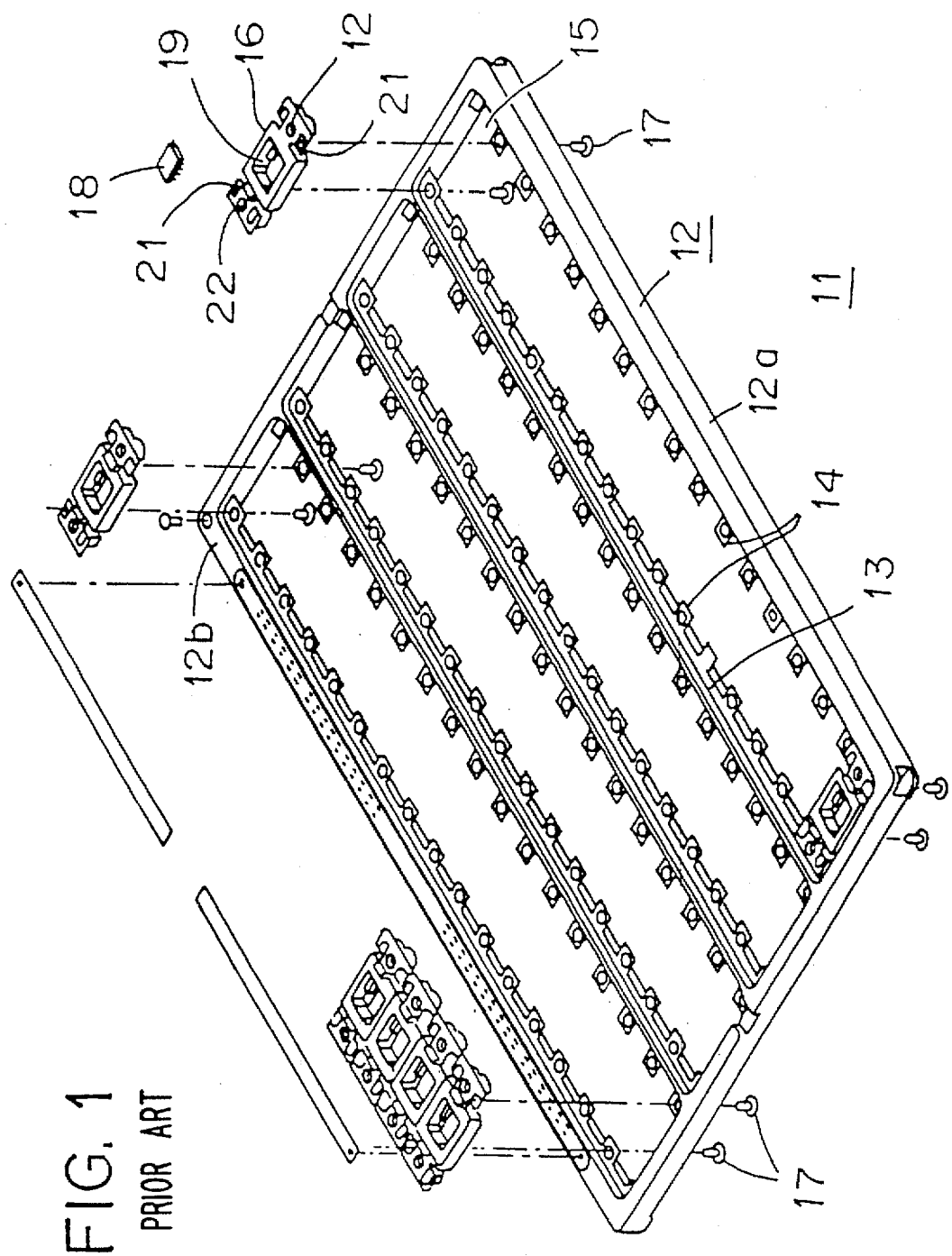
FIG. 1 is a perspective view of the prior art IC transporting tray and IC carrier.
Figure 2A:
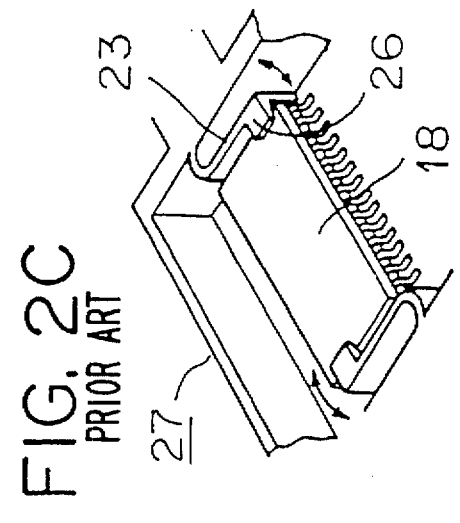
FIGS. 2A–2D are perspective views of the prior art IC carriers illustrating the latch releasing mechanisms operating on the various types of ICs.
Figure 2C:
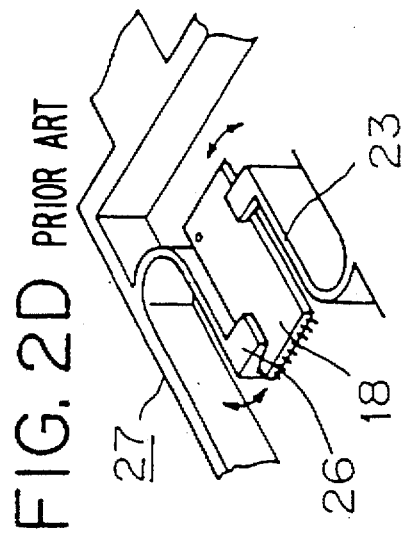
Figure 2B:
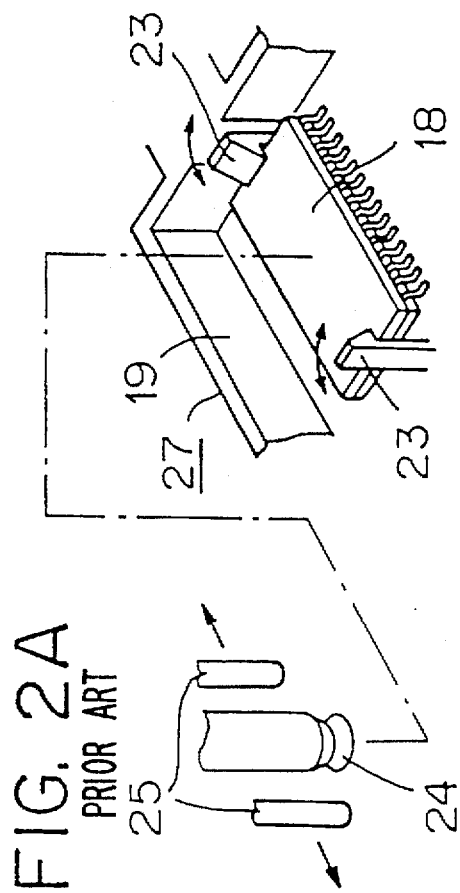
Figure 2D:
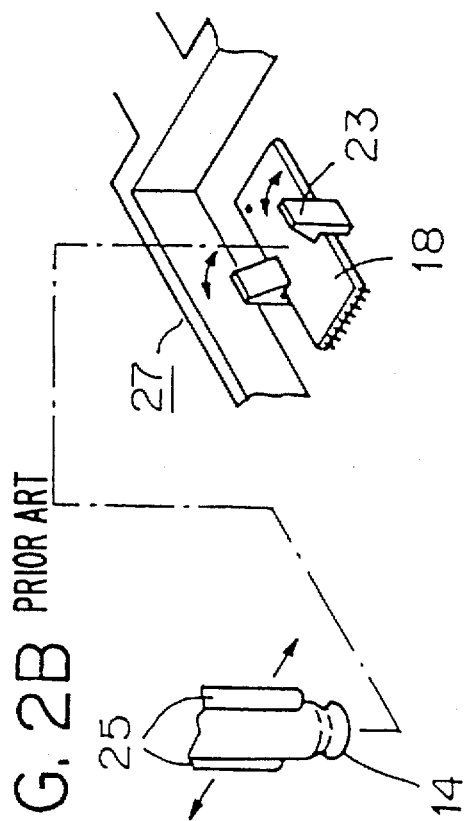

FIGS. 3 to 5B shows the IC carrier according to one embodiment of the first aspect of this invention wherein the parts corresponding to those of FIGS. 1 and 2 are indicated by corresponding reference numerals. According to this invention, a pair of latches 31, 32 are disposed for pivotal movements on opposite sides of an IC device 18 stored in the IC pocket 19 of the IC carrier 16. In this embodiment, vertical slots 33 and 34 are formed centrally through the opposed side walls, respectively of the IC pocket 19 on the sides where the guide pin holes 22 are formed. The slots 33, 34 extend from the top surfaces of the side walls down to an elevation below the bottom surface 19a of the pocket 19 and terminate in base surfaces 33a and 34a, respectively on which the respective latches 31, 32 are disposed. Pivot pins 35 and 36 are passed through the carrier body 27 and the lower portions of the slots 33, 34 in the direction of the array of the holes 21 and 22 and mounted in the body 27. The latches 31, 32 have apertures 37, 38 formed therethrough adjacent their lower ends through which the pivot pins 35 and 36 are passed to pivotally support the latches. The latches 31, 32 have integral hold-down lugs 31a and 32a extending therefrom at their other ends toward the IC pocket 19.

Actuator blocks 39 and 41 are supported for vertical movements in the carrier body 27 adjacent to and at the side of the respective latches 31 and 32 opposite from the IC pocket 19. More specifically, short, generally rectangular actuator blocks 39 and 41 are received vertically slidably in rectangular guide channels 42 and 43 extending vertically through the carrier body 27 from the top thereof and communicating with the slots 33 and 34, respectively. The actuator blocks 39 and 41 are formed with lateral engagement holes 44, 45 intersecting with the side walls of the blocks facing the latches 31, 32. The engagement holes 44, 45 have notches 46, 47 extending downwardly therefrom adjacent the latches 31, 32 as well as relief grooves 44a, 45a extending centrally upwardly therefrom. As best seen in FIGS. 5A and 5B, the engagement holes 44, 45 are formed slightly obliquely such that they extend downwardly as they go away from the IC pocket 19.

Extending from the latches 31, 32 at their other ends oppositely from the hold-down lugs 31a and 32a are integral connecting arms 31b, 32b having short cylindrical protrusions 31c, 32c laterally therefrom on their opposite sides which are adapted to be engaged in the respective engagement holes 44, 45.

In this manner the latches 31, 32 are connected with the actuator blocks 39, 41 so that as the actuator blocks 39, 41 move vertically, the latches 31, 32 are caused to swing about the respective pivot pins 35, 36 to bring the hold-down lugs 31a, 32a into and out of the IC pocket 19. Coil springs 48, 49 are interposed between the bottom surfaces of the actuator blocks 39, 41 and the base surfaces of the guide channels 42, 43 to bias the actuator blocks 39, 41 upwardly while the further upward withdrawal of the blocks 39, 41 is prevented by the engagement of the cylindrical protrusions 31c, 32c in the engagement holes 44, 45 at the notches 46, 47. In this normal state as shown in FIG. 5A, the hold-down lugs 31a, 32a are positioned within the IC pocket 19 with the under surfaces of the lugs lying in a generally horizontal plane and either in close facing relation with or in abutment with the top surface of an IC device 18 stored in the IC pocket 19.

As the actuator blocks 39, 41 are depressed downward to swing the latches 31, 32 so as to bring the hold-down lugs 31a, 32a out of the IC pocket 19 as shown in FIG. 5B, the upper portions of the latches 31, 32 are partially recessed into the notches 46, 47 while the upper portions of the hold-down lugs 31a, 32a are received in the relief grooves 44a, 45a. It is to be appreciated that due to the engagement holes 44, 45 being obliquely formed, a relatively short stroke of the actuator blocks 39, 41 provides swinging of the latches 31, 32 through a relatively large arc.

In addition, in the illustrated embodiment, an actuating plate 51 vertically movable relative to the body 27 is provided and configured to cover substantially the entire top surface of the body except the top surface of the IC 18 accommodated in the IC pocket 19. Specifically, the actuating plate 51 comprises a central frame portion 51a defining a rectangular opening therein and covering the outer peripheral portions of the top of the body 27 surrounding the IC pocket 19, and extension ledges 51b extending from the frame portion 51a at its opposite ends so as to overlie the top surfaces of the corresponding end portions of the body 27, each of the ledges 51b having a hole 53 aligned with the corresponding guide pin hole 22. The frame portion 51a has depending skirts 51c turned downwardly along its opposite side edges other than the end edges from which the extension ledges 51b extend, each of the skirts having an engagement protrusion 54 protruding inwardly therefrom to be received vertically slidably in a corresponding one of vertical grooves 55 formed in the side walls of the body 27. The engagement protrusions 54 and vertical grooves 55 thus constitute the withdrawal-preventing unit and guide unit, respectively to provide for vertical movements of the actuating plate 51 relative to the body 27.

As a matter of course, the actuator blocks 39 and 41 underlie the actuating plate 51 so that the top surfaces of the actuator blocks abut against the actuating plate 51 to bias the latter upwardly. In order that the actuating plate 51 may contact as flat as possible against the top surface of the body 27 without substantially tilting when the actuating plate is depressed against the body, in this embodiment a pair of recessed spring seats 56 are formed on the top surfaces of the opposite end portions of the body 27 on the sides opposite from each other with respect to the guide pin holes 22, and coil springs 57 are interposed between the bases of the seats 56 and the ledges 51b of the actuating plate 51.

When it is desired to place an IC 18 into and remove it from the IC carrier 16 constructed as described above, the suction pick-up unit 62 and positioning unit 63 of the conventional IC set/removal mechanism 61 are simultaneously brought to a position overlying the IC carrier 16 as shown in FIG. 6A, and the positioning unit 63 is first lowered to insert its positioning pins 64 into the guide pin holes 22 whereby the IC set/removal mechanism 61 is aligned with the IC carrier 16 in a horizontal plane while at the same time the mounting plate 65 to which the positioning pins 64 are mounted presses the actuating plate 51 down against the IC carrier 16. The actuating plate 51 in turn depresses the actuator blocks 39, 41 to thereby swing the latches 31, 32 to retract the hold-down lugs 31a, 32a from the IC pocket 19, as shown in FIG. 6B.

The suction pick-up unit 62 is then activated to bring the IC suction pad 24 into contact with the top surface of the IC 18 accommodated in the IC pocket 19 and vacuum attract the IC to the suction pad, whereafter the suction pick-up unit 62 and positioning unit 63 are raised to move the IC 18 to a desired place. The same procedures may be taken to store the IC 18 into the IC pocket 19.

Figure 4A:
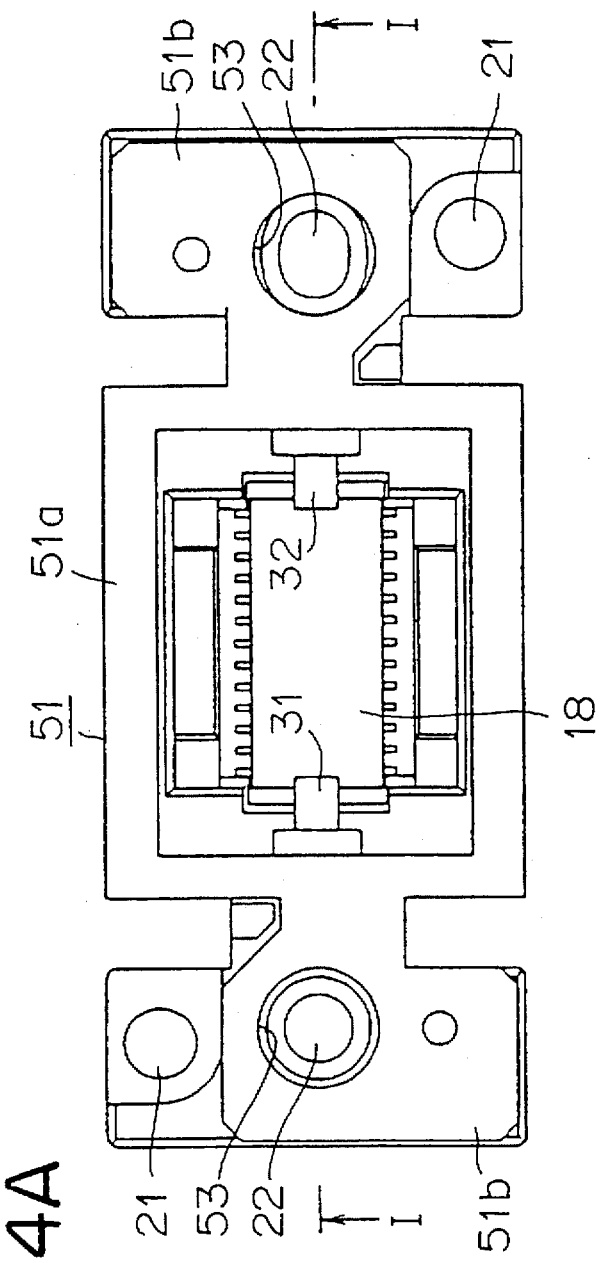
FIG. 4A is a plan view of the embodiment of FIG. 3.
Figure 4B:
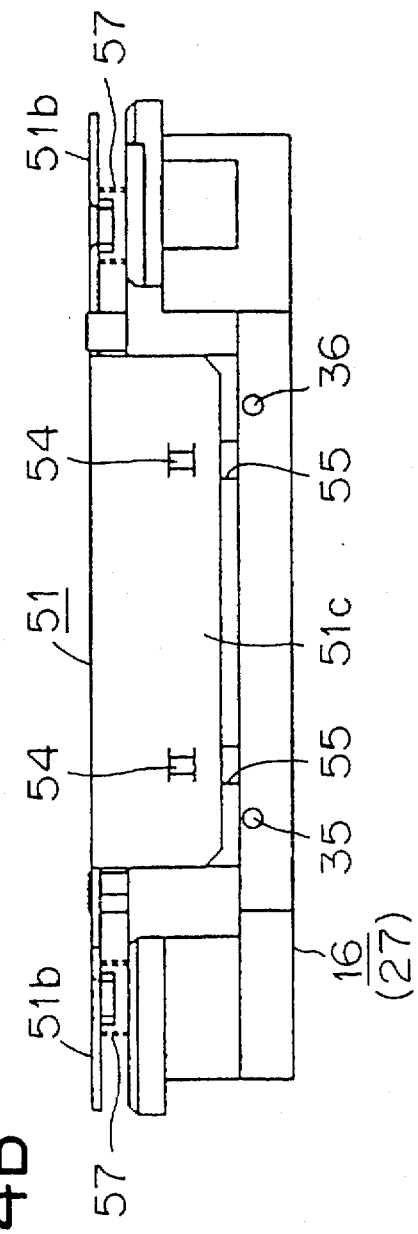
FIG. 4B is a front view of the embodiment of FIG. 4A.
Figure 8:
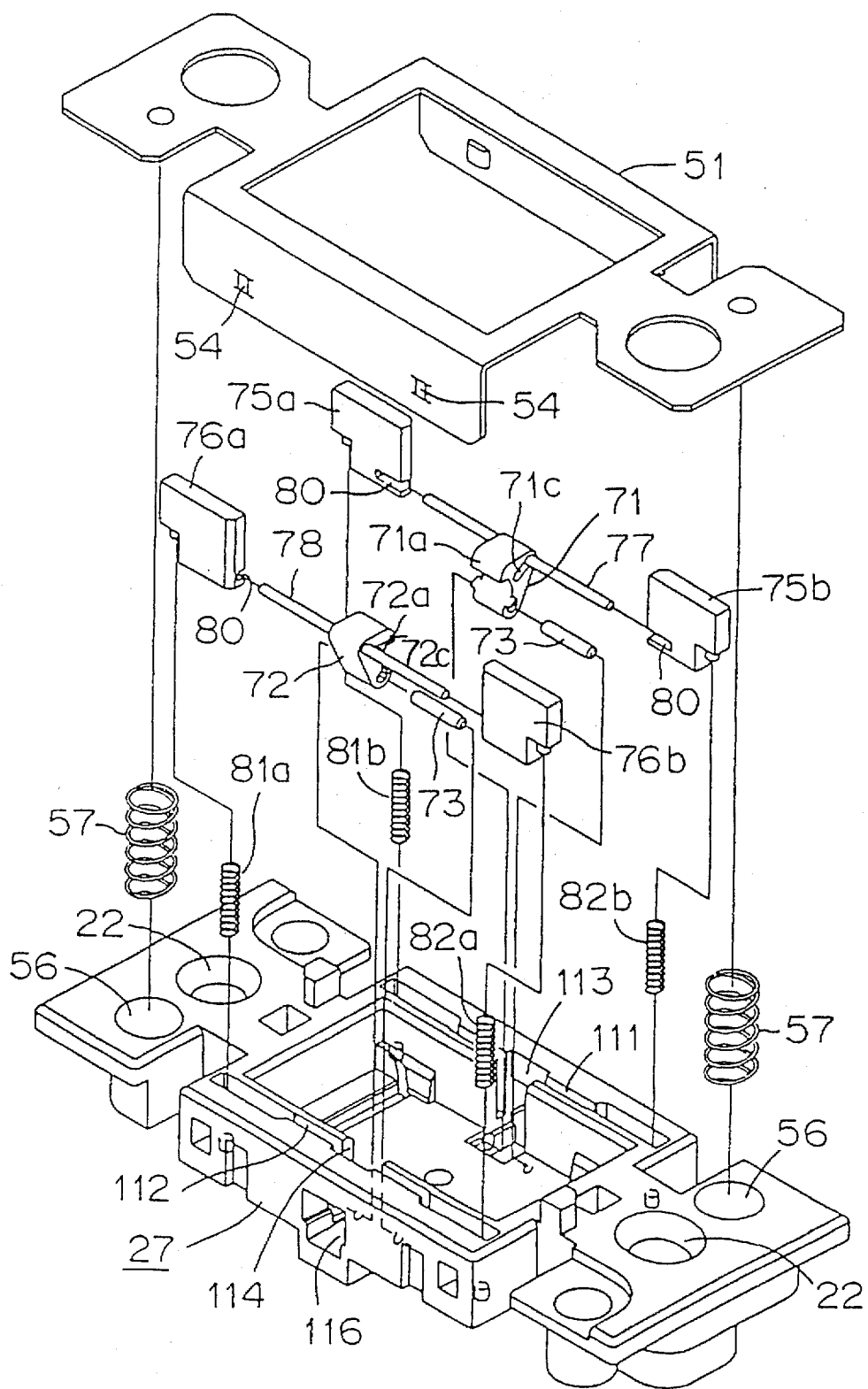
FIG. 8 is an exploded perspective view showing the principal parts of the IC carrier according to still another embodiment of the first aspect of this invention.

FIG. 7 illustrates the principal parts of the IC carrier according to another embodiment of the first aspect of this invention which is adapted to accommodate an IC device 18 having lead pins protruding therefrom on its short sides whereas the embodiment of FIGS. 4A to 4B is adapted for use on an IC device 18 having lead pins protruding from its long sides. In this embodiment, a pair of latches 71, 72 are disposed for pivotal movements generally in the center of the longitudinal side walls of the body 27 defining the IC pocket 19. Pivot pins 73 and 74 are passed through the latches 71, 72 adjacent their lower ends longitudinally of the carrier body 27 to pivotally support the latches and fixed to the body 27. The latches 71, 72 have integral hold-down lugs 71a, 72a and integral bifurcated engagement arms 71b, 72b extending inwardly and outwardly, respectively from their upper ends.

Actuator members 75a and 75b are disposed for vertical movements in the IC pocket 19 at the opposite ends of the side wall thereof adjacent the latch 71, and likewise actuator members 76a and 76b are disposed for vertical movements in the IC pocket 19 at the opposite ends of the side wall thereof adjacent the latch 72. The actuator members 75a and 75b are interconnected by a connecting rod 77 which is received in and engaged by the bifurcate portion of the bifurcated engagement arm 71b, so that as the actuator members 75a, 75b are moved up and down, the latches 71 is caused to swing about the pivot pin 73. Likewise, the actuator members 76a and 76b are interconnected by a connecting rod 78 which is received in and engaged by the bifurcate portion of the bifurcated engagement arm 72b.

Further in this embodiment, the actuator members 75a and 76a are integrally connected together by a connecting crosspiece 79a while the actuator members 75b and 76b are integrally connected together by a connecting crosspiece 79b. The actuator members 75a, 75b, 76a and 76b are urged upwardly against the actuating plate 51 by coil springs 81a, 81b, 82a and 82b, respectively.

In this normal state, the hold-down lugs 71a, 72a are positioned either in close facing relation with or in abutment with the top surface of an IC device 18 stored in the IC pocket 19. Upon the actuator members 75a, 75b, 76a and 76b being depressed downward, the hold-down lugs 71a, 72a are retracted away from the top surface of the IC device 18. It is to be understood that the storing and removing of an IC 18 into and out of the IC pocket 19 may be effected by operating the actuating plate 51 in the same manner as described with reference to FIG. 6.

FIGS. 8 and 9A to 9C illustrates a modified form of the embodiment of FIG. 7 wherein the parts corresponding to those of the previous embodiments are indicated by like reference numerals. In this embodiment, a pair of channels 111 and 112 are formed in the body 27 longitudinally along the upper surfaces of the side walls thereof on the opposite sides of the IC pocket 19. The channels 111 and 112 are adapted to receive the connecting rods 77 and 78 and include opposite widened end portions configured to vertically movably receive the actuator members 75a, 75b, 76a and 76b. The opposite ends of the connecting rods 77 and 78 are press fitted in mounting grooves 80 formed in the sides of the actuator members 75a, 75b, 76a and 76b. The channels 111 and 112 are formed in their longitudinally central portions with latch receiving slots 113, 114 open to the IC pocket 19 and relief apertures 115, 116 opposing the latch receiving slots 113, 114 and extending through the outer wall sides of the body 27. The latches 71, 72 are housed in the latch receiving slots 113 and 114, respectively.

In this embodiment, the latches 71, 72 have hold-down lugs 71a, 72a and engagement arms 71b, 72b extending in opposite directions from their upper ends. The connecting rods 77 and 78 extend through elongated slots 71c and 72c, respectively formed through the engagement arms 71b and 72b. The elongated slots 71c and 72c are spaced away from the respective pivot axes of the latches 71 and 72 and extend at an angle with respect to radial lines passing through the respective pivot axes so as to pivot the latches 71 and 72 about their pivot axes as the connecting rods 77 and 78 are moved vertically.

Figure 9A:
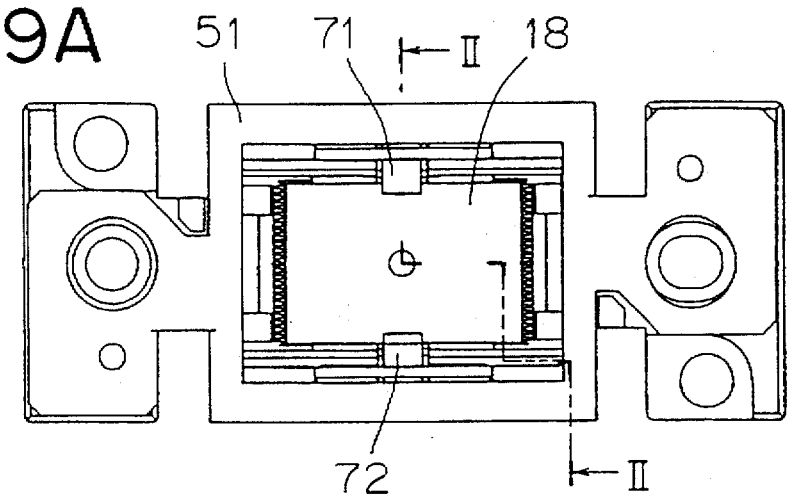
FIG. 9A is a plan view of the embodiment of FIG. 8.
Figure 9B:
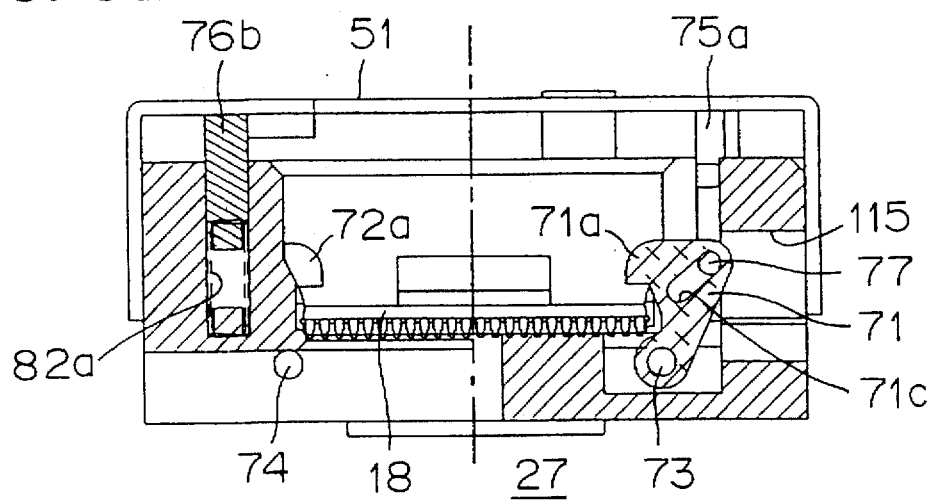
FIG. 9B is a cross-sectional view of the IC carrier of FIG. 9A taken along the line II—II with the actuating plate 51 removed.
Figure 9C:
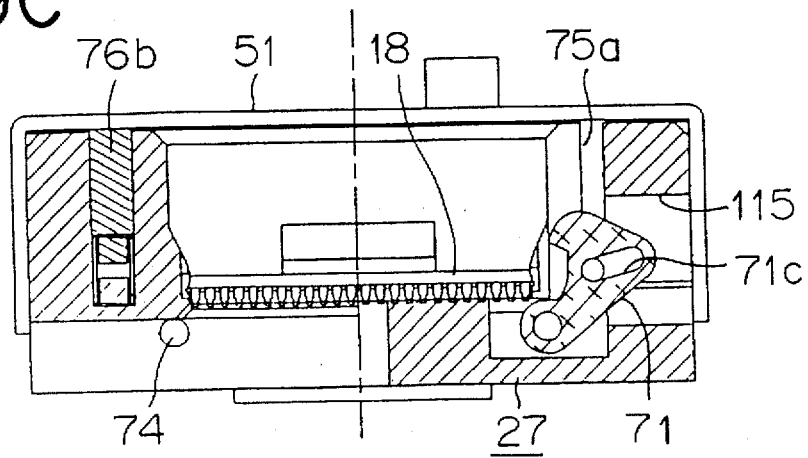
FIG. 9C is a cross-sectional view similar to FIG. 9B but illustrating the actuating plate 51 depressed.

In the position as shown in FIG. 9B where the hold-down lugs 71a, 72a overlie the top surface of an IC 18 stored in the IC pocket 19, the elongated slots 71c, 72c are oriented to extend obliquely upwardly as they go away from the IC pocket 19 so that the latches 71, 72 are caused to swing through a relatively large arc in response to the vertical movement of the connecting rods 77, 78. Upon the actuating plate 51 being depressed, the connecting rods 77, 78 are lowered to swing the latches 71, 72 to thereby retract the hold-down lugs 71a, 72a away from the top surface of the IC device 18 while portions of the latches 71, 72 are received in the relief apertures 115, 116, as shown in FIG. 9C.

Figure 10A:
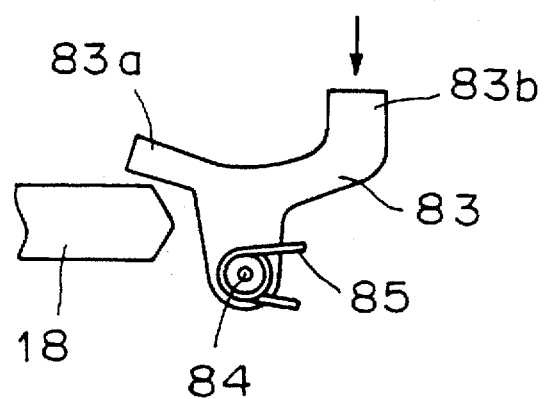
FIG. 10A is a side view showing the principal parts of an embodiment of the second aspect of this invention.

FIG. 10A shows the principal parts of an embodiment of the second aspect of this invention. While the latch and its actuator block or member are separately provided in the foregoing embodiments, the second aspect of this invention is characterized in the latch and its actuator member being formed in a unitary piece. According to this aspect of the invention, the latch 83 is mounted at its lower end to the carrier body 27 for pivotal movements by a pivot pin 84 while the latch 83 has an integral hold-down lug 83a extending from its upper end toward the center of the IC pocket 19 and an integral actuator member 83b extending outwardly from the upper end of the latch and then turned upwardly. The latch 83 is further provided with a spring 85 acting to pivot the hold-down lug 83a toward the interior of the IC pocket 19. While the spring 85 is shown as comprising a torsion spring wound around the pivot pin 84, it may be a spring urging the actuator member 83b upwardly. The hold-down lug 83a is normally either in close facing relation with or in abutment with the top surface of an IC device 18 stored in the IC pocket 19, but when the actuator member 83b is depressed down, the latch 83 is pivotted against the biasing force of the spring 85 to move the hold-down lug 83a away from the position facing the top surface of the IC 18.

Figure 3:
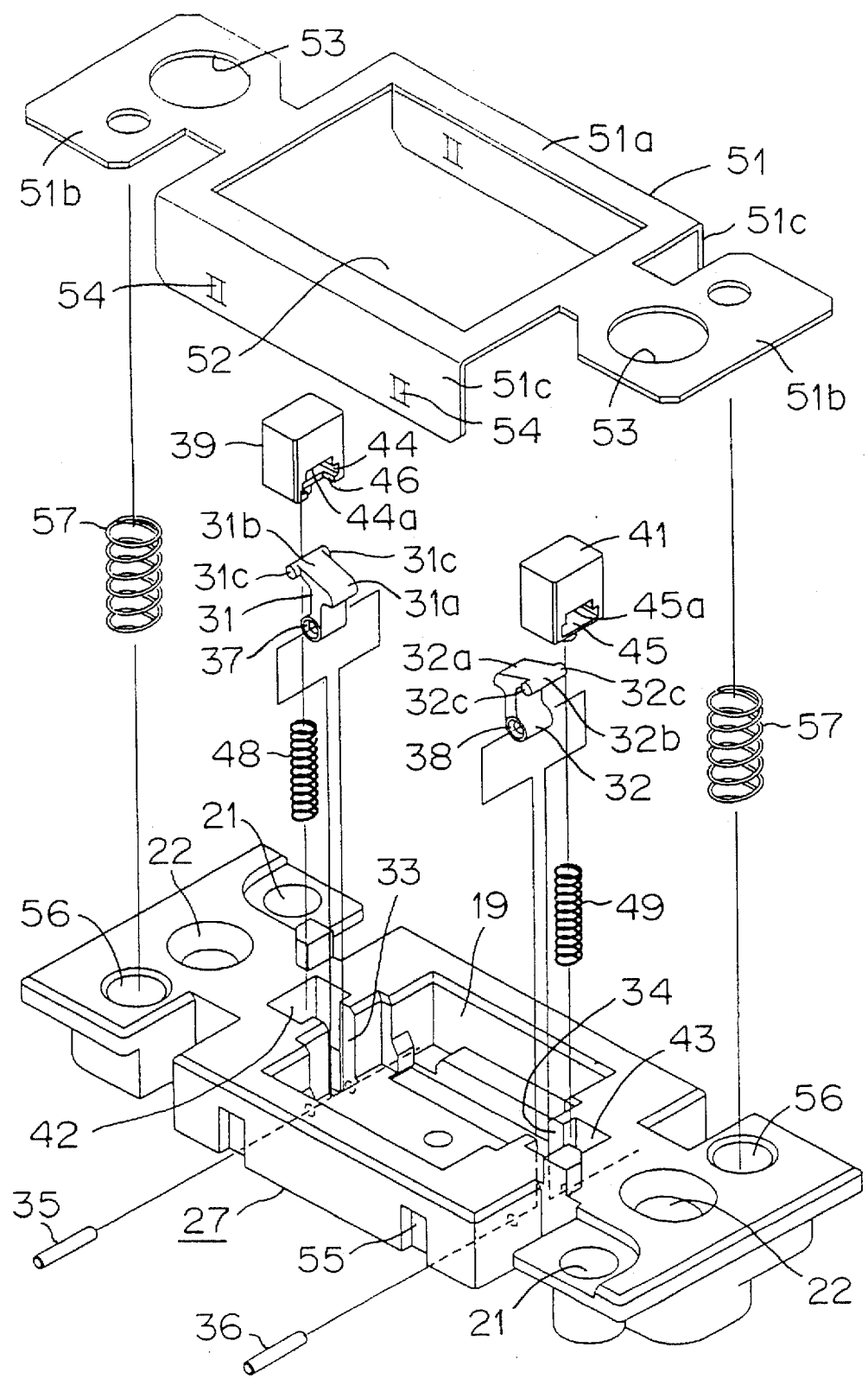
FIG. 3 is an exploded perspective view of the IC carrier according to one embodiment of the first aspect of this invention.
Figure 10B:
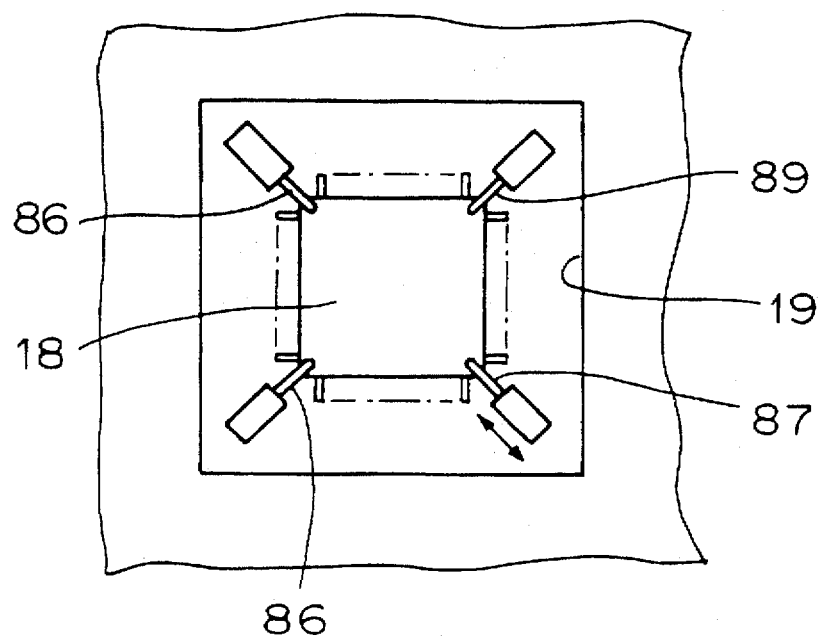
FIG. 10B is a plan view illustrating another example of the arrangement of latches relative to the IC in the IC carrier.
Figure 11:
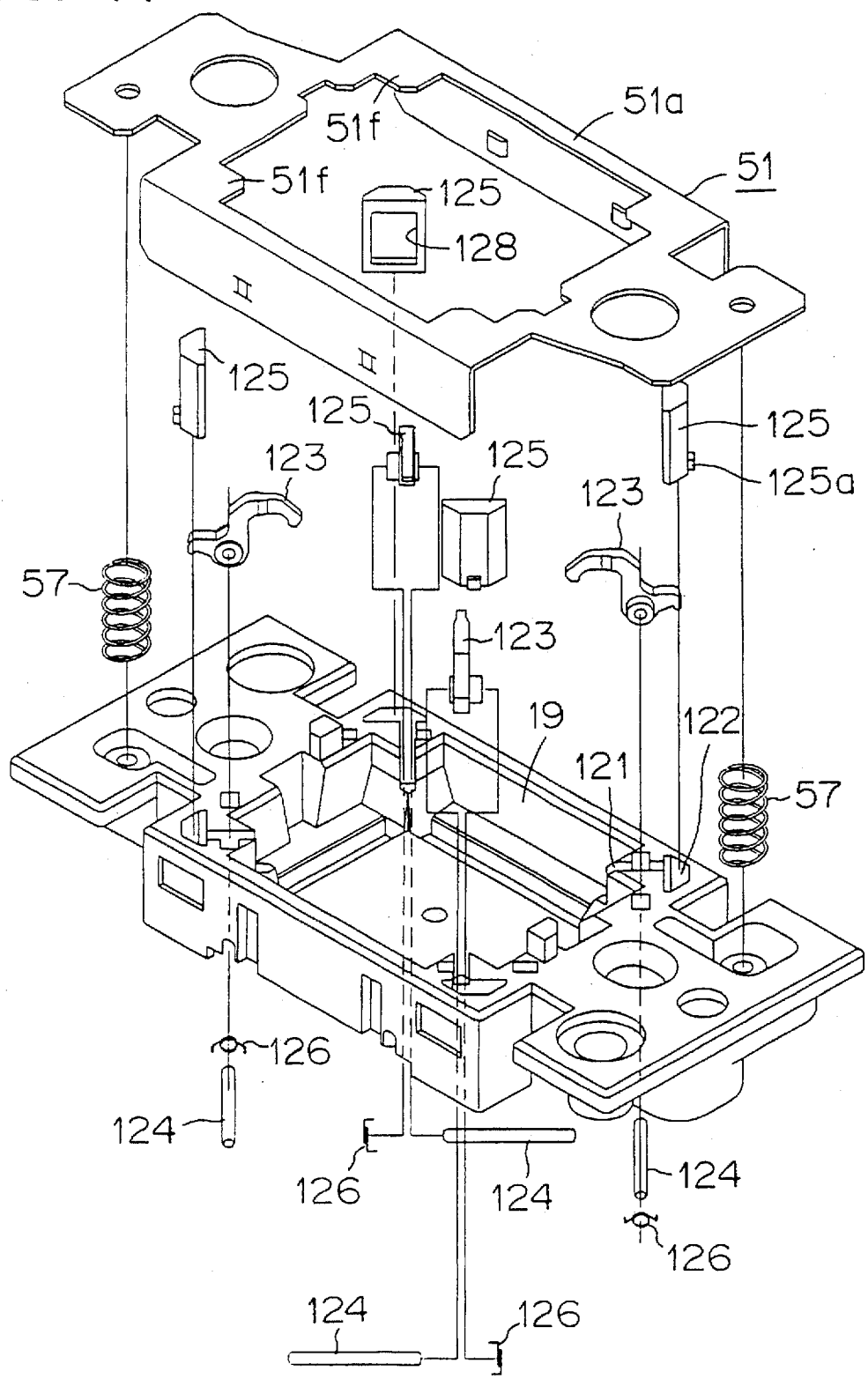
FIG. 11 is an exploded perspective view of the IC carrier according to yet another embodiment of the first aspect of this invention.

While the IC device 18 is illustrated hereinabove as being held down on its opposed sides by two hold-down lugs, the present invention also contemplates holding an IC 18 down on a pair of diagonal locations by latches 86 and 87. In this case, another pair of diagonally located latches 88 and 89 may be added, if desired, as shown in FIG. 10B. A specific embodiment embodying this concept is shown in FIGS. 11 and 12 in which the parts corresponding those of FIG. 3 are indicated by like reference numerals.

Latch receiving channels 121 are formed in the top surface of the carrier body 27 at four corners of the IC pocket 19 so as to extend radially toward the center of the IC pocket 19. Formed so as to communicate with the end of respective latch receiving channels 121 opposite from the IC pocket 19 are actuator guide slots 122 in each of which a latch 123 is received and pivotally mounted intermediate its opposite ends to the body 27 by a pivot pin 124. The latch 123 has an inner end portion extending upwardly from the central portion at the pivot pin 124 and then turned inwardly into the IC pocket 19 and terminating in a hold-down lug 123a and an outer end portion extending outwardly from the central portion at an approximately right angle with respect to the upwardly extending section of the inner end portion and terminating in an engagement arm 123b.

The engagement arm 123b is located so as to extend into the corresponding actuator guide slot 122 in which an actuator member 125 rides on and is vertically movably supported. A torsion spring is connected at one end with the engagement arm 123b of the latch 123 and at the other end with the body 27 to bias the latch 123 in such a direction of rotation as to bias the actuator member 125 upwardly. The actuator member 125 has a projection 125a extending from the side wall thereof opposite from the IC pocket 19 such that the projection 125a will be engaged with a stop 127 provided at the upper end of the guide slot to prevent the upward withdrawal of the actuator member 125.

Figure 12A:
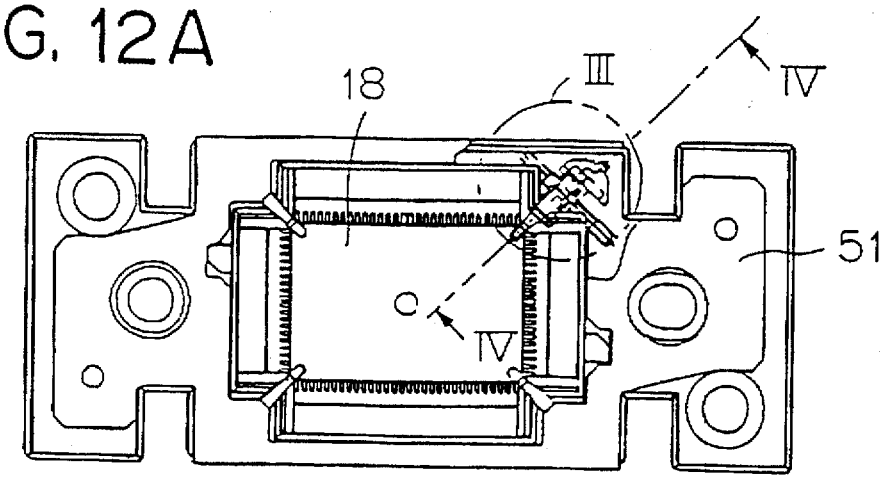
FIG. 12A is a partial cutaway plan view of the IC carrier of FIG. 11.
Figure 12B:
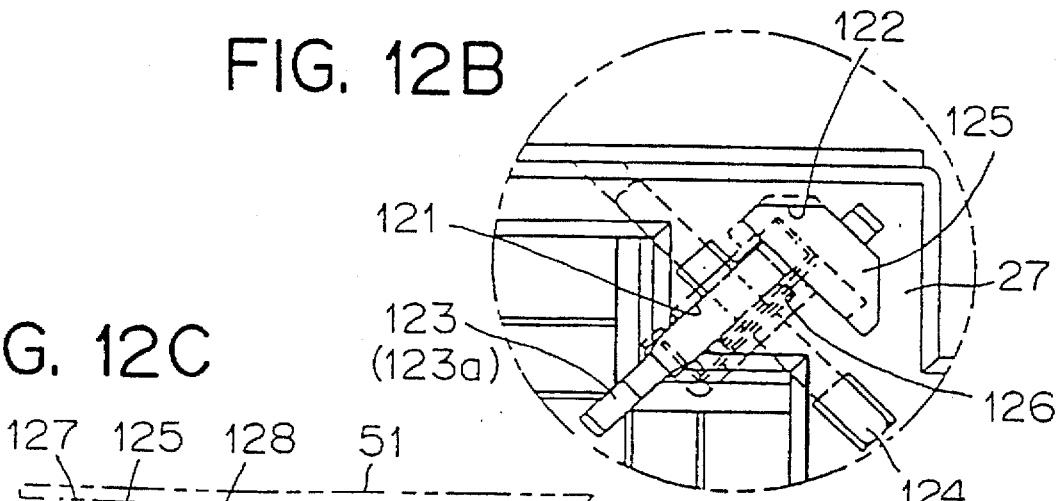
FIG. 12B is an enlarged plan view of a part surrounded by a circle III in FIG. 12A.
Figure 12C:
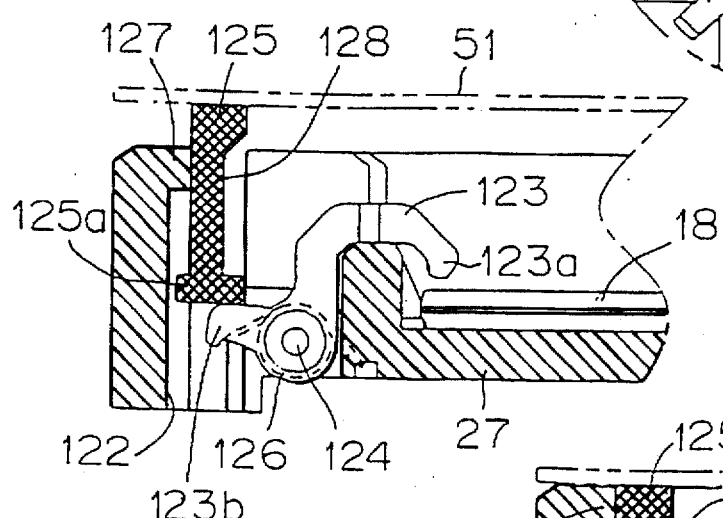
FIG. 12C is a cross-sectional view of the IC carrier of FIG. 12A taken along the line IV—IV.
Figure 12D:
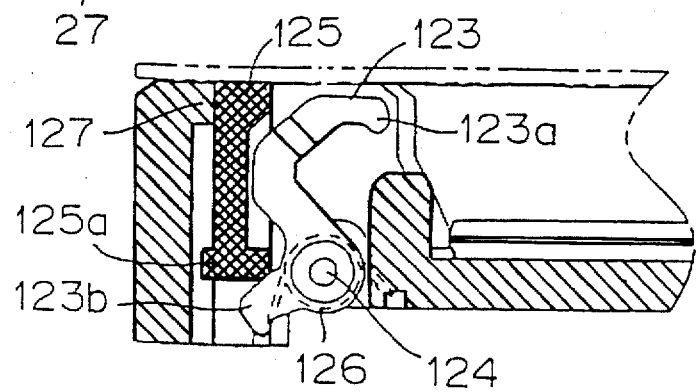
FIG. 12D is a cross-sectional view similar to FIG. 12C but illustrating the actuating plate 51 depressed.

The actuator member 125 has a relief recess 128 formed in the side wall thereof facing the IC pocket 19 such that as the actuator member 125 is depressed to swing the latch 123, the hold-down lug 123a is retracted from the IC pocket 19 while a portion of the latch is received into the relief recess 128, as shown in FIG. 12D.

In this embodiment an actuating plate 51 is mounted on the carrier body 27 so as to drive the actuator member 125. The actuating plate 51 is essentially identical to the actuating plate 51 of FIG. 3 except that the generally rectangular frame portion 51a is formed with integral actuating extensions 51f at the internal four corners, each of the actuating extensions 51f overlying the corresponding actuator member 125.

In the embodiments described hereinabove, the actuator member 39, 41; 75a, 75b, 76a, 76b; 83b; or 125 may be directly controlled by the IC set/removal mechanism 61. In that case, however, it is required to vary the control means of the IC set/removal mechanism 61 operating on the actuator member depending on the type of the IC being handled.

Figure 13A:
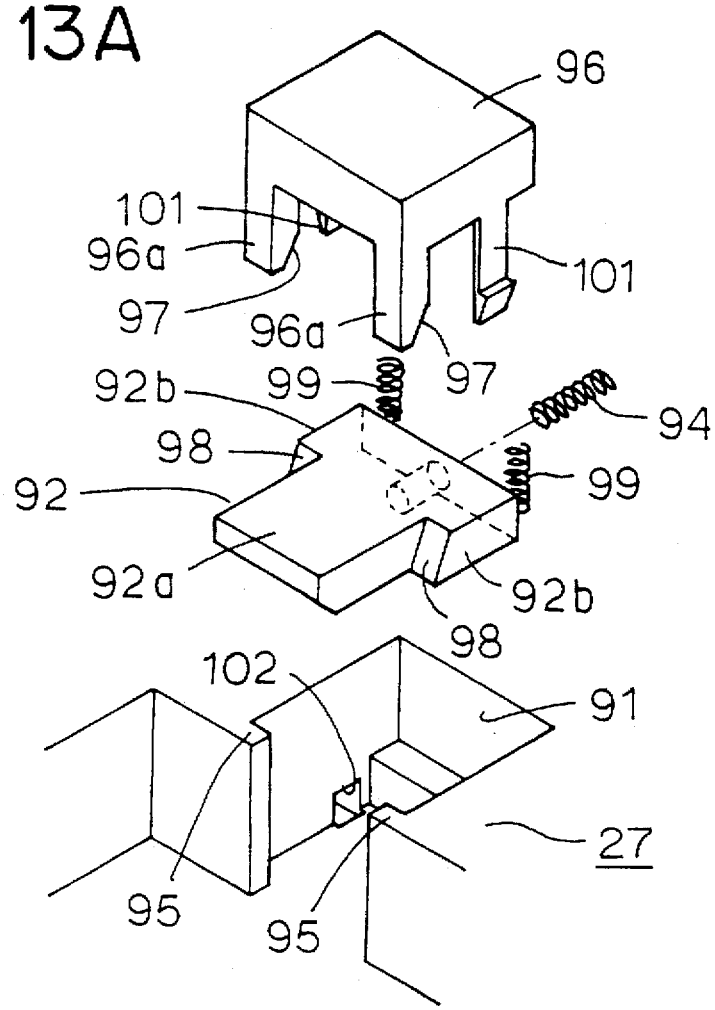
FIG. 13A is an exploded perspective view showing the principal parts of the IC carrier according to an embodiment of the third aspect of this invention.
Figure 13B:
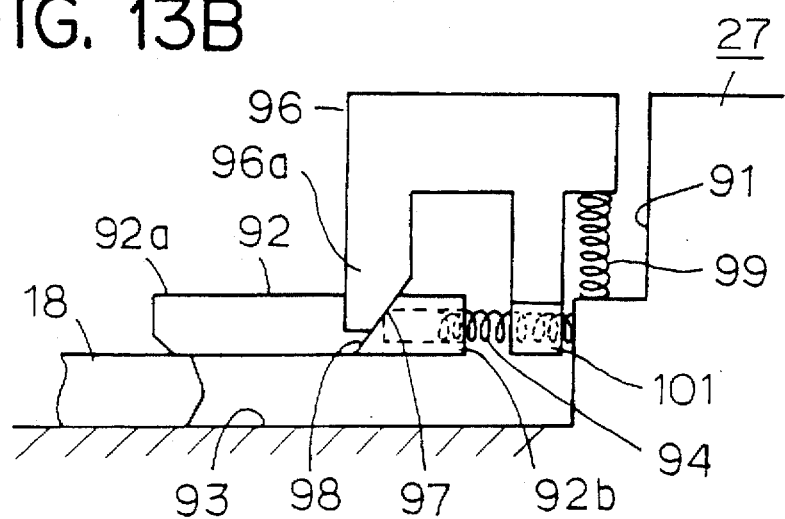
FIG. 13B is a cross-sectional view of the IC carrier of FIG. 13A in its assembled state.

While the latch is arranged to be pivotted about an axis parallel to the support surface of the IC pocket on which an IC device is seated in the previous embodiments, it is possible to provide for moving the latch generally parallel to the support surface for the IC device. This is a third aspect of this invention. The principal parts of the IC carrier according to an embodiment of the third aspect are shown in FIG. 13. A rectangular slot 91 is formed in the upper surface of the carrier body 27 at each end thereof and opens to the IC pocket 19. A latch 92 is disposed in the rectangular slot 91 for movement into and out of the IC pocket 19 in a direction generally parallel to the support surface 93 of the IC pocket 19 on which an IC device 18 is seated. The latch 92 has a hold-down piece 92a at one end which is adapted to be extended to a position facing or abutting with the top surface of the IC 18 stored in the IC pocket 19 and to be retracted into the slot 91. The latch 92 is normally biased toward the IC pocket 19 by a coil spring 94. Extending laterally from the opposite sides of the the latch 92 at the other end opposite from the IC pocket 19 are stop projections 92b which are adapted to engage with withdrawal-preventing unit 95 provided on the opposed walls of the rectangular slot 91 adjacent the IC pocket 19 to prevent withdrawal of the latch 92 out of the slot 91.

Vertically movably mounted in the rectangular slot 91 is a generally rectangular actuator member 96 having a pair of integral legs 96a extending downward to straddle the hold-down piece 92a of the the latch 92, each of the legs having a tapered camming surface 97 at the lower end on the side opposite from the IC pocket 19. Formed on the side of the corresponding stop projection 92b facing the tapered camming surface 97 is a complementarily tapered surface 98. As the actuator member 96 is depressed down, the camming surfaces 97 cooperate with the corresponding tapered surfaces 98 to retract the latch 92 from the IC pocket 19 against the biasing force of the spring 94.

The actuator member 96 further has a pair of anchor legs 101 extending downward on the side opposite from the IC pocket 19, each of the legs 101 having a pawl protruding therefrom at the lower end which is engaged in a corresponding one of engagement recesses 102 formed in the opposed inner side walls of the rectangular slot 91 to prevent withdrawal of the actuator member 96 out of the slot 91.

It is to be appreciated from the foregoing descriptions that according to the first to third aspects of this invention, the latch unit is not prone to deteriorate notwithstanding numerous repeated uses, that is, can enjoy a long useful life since the latch unit is provided separately from the carrier body 27 and arranged to be returned to its normal position by means of the coil spring or torsion spring.

Further, according to the fourth aspect of this invention, the carrier body 27 can be covered by the actuating plate 51 of essentially identical structure for any type of IC device handled and the latch unit can be released by controlling the actuating plate 51, making it possible to employ the IC set/removal mechanism 61 in common to all types IC devices handled.

We claim:

1. An IC carrier for removably storing an IC device in place and transporting it, said IC carrier comprising:
    a body defining an IC pocket for removably storing an IC device therein;
    a pair of latches pivotally mounted to said body on opposite sides of said IC device stored in said IC pocket respectively, each of said latches comprising a hold-down lug responsive to the pivotal motion of the latch to be moved between a first position facing a top surface of said IC device and a second position removed from said top surface;
    a pair of actuator means each mounted for vertical movements in said body and drivingly connected with a corresponding one of said latches so as to pivot the corresponding latch between said first position and said second position; and
    a pair of spring means each mounted to said body to bias an associated actuator means of the pair of actuator means upwardly to pivot an associated latch of the pair of latches to said first position.

2. An IC carrier for removably storing an IC device in place and transporting it, said IC carrier comprising:
    a body defining an IC pocket for removably storing an IC device therein, said IC pocket being a rectangular recess;
    a pair of latches pivotally carried at their lower ends by said body on opposite sides of said IC device stored in said IC pocket respectively, each of said latches comprising a hold-down lug provided at its upper end and responsive to the pivotal motion of the latch to be moved between a first position facing the top surface of said IC device and a second position removed from said top surface;
    a pair of actuator means each mounted for vertical movements in said body and drivingly connected with a corresponding one of said latches so as to pivot the associated latch between said first position and said second position;
    a pair of spring means each mounted to said body to bias the associated actuator means upwardly to pivot the associated latch to said first position; and
    a pair of opposed latch receiving slots each formed in the top surface of said body so as to communicate with said IC pocket, each of said latches being received in a corresponding one of said latch receiving slots, said hold-down lug being adapted to extend into said IC pocket when it is in said first position and to be retracted into the corresponding latch receiving slot when it is in said second position.

3. The IC carrier of claim 2, further comprising a pair of guide holes each formed in the top surface of said body so as to communicate with one of said latch receiving slots on the side opposite from said IC pocket, each of said actuator means being guided in its vertical movements in one of said guide holes.

4. The IC carrier of claim 3, wherein each of said latch receiving slots has a bottom surface located below the bottom surface of said IC pocket.

5. The IC carrier of claim 4, wherein each of said spring means comprises a coil spring interposed between the bottom surface of one of said guide holes and one of said actuator means.

6. The IC carrier of claim 3, wherein each of said actuator means is generally rectangular in shape and each of said guide holes is a generally rectangular hole.

7. The IC carrier of claim 6, wherein each of said latches has an integral connecting arm extending therefrom at its upper end oppositely from said hold-down lug, each of said actuator means having an engagement hole formed in the side wall thereof facing said IC pocket, and the end portion of the corresponding connecting arm being engaged in said engagement hole to connect said latch and the associated actuator means.

8. The IC carrier of claim 7, wherein each of said engagement holes has a notch formed centrally at an end adjacent said IC pocket, each of said connecting arms having short cylindrical protrusions extending therefrom on its opposite sides, said protrusions being engaged in said engagement hole on opposite sides of said notch, and with said hold-down lugs being positioned in the respective latch receiving slots, said latches and/or said connecting arms being adapted to be partially positioned in said respective notches.

9. The IC carrier of claim 8, wherein each of said engagement holes has a relief groove extending centrally upwardly therefrom, and with said hold-down lugs being positioned in the respective latch receiving slots, said latches and/or said connecting arms being adapted to be partially positioned in said respective relief grooves.

10. The IC carrier of claim 9, wherein each of said engagement holes is formed slightly obliquely such that it extends downwardly as it goes away from said IC pocket.

11. The IC carrier of claim 6, wherein said latch receiving slots are formed in the opposed walls of said IC pocket extending perpendicularly to the length of said body.

12. The IC carrier of claim 6, wherein each of said latches has an integral engagement portion extending therefrom at its lower end on the side of the center of the pivotal motion of the latch opposite from said hold-down lug, said engagement portion being received in the corresponding guide hole and the associated actuator means resting on said engagement portion.

13. The IC carrier of claim 12, wherein said latch receiving slots are provided at a pair of diagonally opposed corners of said IC pocket.

14. The IC carrier of claim 13, wherein there are another pair of said latch receiving slots provided at another pair of diagonally opposed corners of said IC pocket.

15. The IC carrier of claim 13, wherein said spring means comprise torsion springs acting generally about the pivot axes of the respective latches.

16. The IC carrier of claim 2, wherein the corresponding latch and actuator means are integrally connected together.

17. The IC carrier of claim 2, wherein said latches are located adjacent to a pair of diagonal locations of said IC device stored in said IC pocket.

18. The IC carrier of claim 17, wherein another pair of latches are located adjacent another pair of diagonal locations of said IC device stored in said IC pocket.

19. The IC carrier of claim 2, wherein an actuating plate configured to cover substantially the entire top surface of said body except the top surface of said IC stored in said IC pocket is vertically movably carried by said body, said actuator means underlying said actuating plate.

20. The IC carrier of claim 19, wherein said actuating plate includes a central frame portion covering substantially the entire outer periphery around said IC pocket, and integral extension ledges extending from said frame portion at its opposite ends so as to cover substantially the entire top surfaces of the corresponding end portions of said body and to overlie said actuator means.

21. The IC carrier of claim 20, wherein said frame portion has depending skirts turned downwardly along its opposite side edges other than the end edges from which said extension ledges extend, each of said skirts having an engagement protrusion protruding therefrom to be received in a corresponding one of vertical grooves formed in the side walls of said body.

22. The IC carrier of claim 21, wherein a pair of recessed spring seats are formed on the top surfaces of the opposite end portions of said body, coil springs being interposed between the bases of said seats and the corresponding extension ledges of said actuating plate, respectively.

23. The IC carrier of claim 22, wherein a pair of guide pin holes are formed in the upper surfaces of said opposite end portions of said body, each of said extension ledges having a hole aligned with the corresponding guide pin hole, and said recessed spring seats on the opposite end portions of said body being positioned oppositely from each other with respect to said guide pin holes.

24. An IC carrier for removably storing an IC device in place and transporting it, said IC carrier comprising:

a body defining an IC pocket for removably storing an IC device therein, said IC pocket being a rectangular recess;

a pair of latches pivotally mounted to said body on opposite sides of said IC device stored in said IC pocket respectively, said latches being disposed centrally at a pair of opposed walls of said IC pocket and pivotally carried at their lower ends by said body respectively;

a hold-down lug integrally formed with each of said latches at its upper end and responsive to the pivotal motion of the latch to be moved between a first position facing the top surface of said IC device and a second position removed from said top surface, said hold-down lug protruding from the upper end of the latch toward the center of said IC pocket;

an engagement arm integrally formed with each of said latches at its upper end and extending oppositely from said hold-down lug;

a pair of connecting rods extending along said opposed walls of said IC pocket respectively, each of said connecting rods engaging with said engagement arm;

two pairs of actuator means each mounted for vertical movements in said body, each pair of the actuator means being fixed to corresponding one of said connecting rods at its opposite ends and driving corresponding one of said latches through the connecting rod engaging with the engagement arm of said one latch so as to pivot said latch between said first and said second positions; and a plurality of spring means each mounted to said body to bias the associated actuator means upwardly.

25. The IC carrier of claim 24, wherein a pair of channels are formed in the upper surface of said body generally parallel to said opposed walls of said IC pocket, each of said channels being adapted to receive one of said connecting rods and including widened guide portions at its opposite ends configured to vertically movably receive said actuator means respectively, and each of said channels including a longitudinally central latch receiving slot formed in the upper surface of said body in communication with said IC pocket and adapted to receive one of said latches.

26. The IC carrier of claim 25, wherein said spring means comprises a coil spring interposed between the bottom surface of each of said guide portions and said actuator means to bias the associated actuator means.

27. The IC carrier of claim 26, wherein a relief aperture is formed in said body in communication with each of said channels and in opposition to the corresponding latch receiving slot, and when the associated hold-down lug is moved away from the top surface of said IC device, a portion of said latch being adapted to be received in said relief aperture.

28. The IC carrier of claim 25, wherein said opposed walls of said IC pocket extend parallel to the length of said body.

29. The IC carrier of claim 24, wherein each of said engagement arms is bifurcated, each of said connecting rods being received in and engaged by the bifurcate portion of the associated engagement arm.

30. The IC carrier of claim 24, wherein each of said engagement arm has an elongated slot formed therethrough which is spaced away from the pivot axis of the corresponding latch and which extends at an angle with respect to a radial line passing through said pivot axis, and the associated connecting rod extending through said elongated slot so as to pivot said latch about the pivot axis as said connecting rod is moved vertically.

31. The IC carrier of claim 24, wherein the actuator means fixed to said connecting rods at their one ends are integrally connected by a first connecting crosspiece while the actuator means fixed to said connecting rods at their other ends are integrally connected by a second connecting crosspiece.

32. The IC carrier of claim 24, wherein an actuating plate configured to cover substantially the entire top surface of said body except the top surface of said IC stored in said IC pocket is vertically movably carried by said body, said actuator means underlying said actuating plate.

33. An IC carrier for removably storing an IC device in place and transporting it, said IC carrier comprising:

a body defining an IC pocket for removably storing an IC device therein;

a pair of latches mounted to said body on opposite sides of said IC device stored in said IC pocket for movement in a direction generally parallel to a support surface on which said IC device is supported in said IC pocket, respectively, each of said latches comprising a hold-down piece adapted to be moved between a first position facing the top surface of said IC and a second position retracted from said top surface as said latch is moved;

a pair of actuator means each mounted for vertical movements in said body and drivingly connected with corresponding one of said latches so as to move the associated latch in said direction generally parallel to the support surface by the vertical movements of the associated actuator means; and a pair of spring means each mounted to said body to bias the associated actuator means upwardly.

34. The IC carrier of claim 33, wherein an actuating plate configured to cover substantially the entire top surface of said body except the top surface of said IC stored in said IC pocket is vertically movably carried by said body, said actuator means underlying said actuating plate.

35. The IC carrier of claim 34, wherein said actuating plate includes a central frame portion covering substantially the entire outer periphery around said IC pocket, and integral extension ledges extending from said frame portion at its opposite ends so as to cover substantially the entire top surfaces of the corresponding end portions of said body and to overlie said actuator means.

36. The IC carrier of claim 35, wherein said frame portion has depending skirts turned downwardly along its opposite side edges other than the end edges from which said extension ledges extend, each of said skirts comprising an engagement protrusion protruding therefrom to be received in a corresponding one of vertical grooves formed in the side walls of said body.

37. The IC carrier of claim 36, wherein a pair of recessed spring seats are formed on the top surfaces of the opposite end portions of said body, coil springs being interposed between the bases of said seats and the corresponding extension ledges of said actuating plate, respectively.

38. The IC carrier of claim 37, wherein a pair of guide pin holes are formed in the upper surfaces of said opposite end portions of said body, each of said extension ledges comprising a hole aligned with the corresponding guide pin hole, and said recessed spring seats on the opposite end portions of said body being positioned oppositely from each other with respect to said guide pin holes.

* * * * *